(12) United States Patent
Tomioka et al.

(10) Patent No.: US 8,045,327 B2
(45) Date of Patent: Oct. 25, 2011

(54) ELECTRONIC APPARATUS

(75) Inventors: Kentaro Tomioka, Sayama (JP);
Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/860,360

(22) Filed: Aug. 20, 2010

(65) Prior Publication Data
US 2011/0075365 A1  Mar. 31, 2011

(30) Foreign Application Priority Data
Sep. 30, 2009  (JP) .............................. 2009-228134

(51) Int. Cl.
*H05K 7/20* (2006.01)

(52) U.S. Cl. ......... 361/679.47; 361/679.48; 361/679.49; 361/679.5; 361/695; 165/80.3; 165/104.33; 165/104.34; 165/122; 454/184

(58) Field of Classification Search ......... 361/679.46–5, 361/690–697, 704–712, 714, 719, 720–724; 165/80.3, 80.4, 80.5, 104.14, 104.21, 104.33, 165/104.34, 121–126, 185; 174/16.3, 252; 454/184
See application file for complete search history.

(56) References Cited

U.S. PATENT DOCUMENTS

| | | | | |
|---|---|---|---|---|
| 6,141,214 A * | 10/2000 | Ahn | ......................... | 361/679.48 |
| 6,266,243 B1 * | 7/2001 | Tomioka | ....................... | 361/695 |
| 6,924,978 B2 * | 8/2005 | DiStefano | ..................... | 361/688 |
| 6,934,148 B2 * | 8/2005 | Gorenz et al. | ............ | 361/679.46 |
| 7,298,615 B2 * | 11/2007 | Wong | ........................ | 361/679.48 |
| 7,310,227 B2 * | 12/2007 | Kusamoto et al. | ............ | 361/695 |
| 7,764,493 B2 * | 7/2010 | Ali et al. | ................... | 361/679.51 |
| 7,898,805 B2 * | 3/2011 | MacDonald | ................... | 361/695 |
| 2006/0146493 A1 * | 7/2006 | Wang et al. | .................... | 361/687 |
| 2008/0112130 A1 * | 5/2008 | Nakamura | ..................... | 361/687 |
| 2008/0253088 A1 * | 10/2008 | Tracy et al. | .................... | 361/695 |
| 2009/0201639 A1 * | 8/2009 | Wang et al. | .............. | 361/679.54 |

FOREIGN PATENT DOCUMENTS

| | | |
|---|---|---|
| JP | 60-107898 A | 6/1985 |
| JP | 06-125187 | 5/1994 |
| JP | 06-125187 A | 5/1994 |

(Continued)

OTHER PUBLICATIONS

Notification of Reasons for Rejection mailed by Japan Patent Office on Oct. 26, 2010 in the corresponding Japanese patent application No. 2009-228134.

*Primary Examiner* — Michail V Datskovskiy
(74) *Attorney, Agent, or Firm* — Knobbe, Martens Olson & Bear, LLP

(57) ABSTRACT

According to one embodiment, an electronic apparatus includes a housing, a partition, a first cooling fan, and a second cooling fan. The partition partitions an inside of the housing into a first chamber and a second chamber. The first chamber communicates with a first inlet, a third inlet, and a first outlet. The second chamber communicates with a second inlet and a second outlet. The first cooling fan locates above the third inlet in the first chamber, and includes a first intake configured to draw air in the first chamber, and a second intake configured to draw air outside the housing through the third inlet, the first cooling fan being configured to discharge the air to a heat sink. The second cooling fan locates in the second chamber and is configured to draw air in the second chamber, and to discharge the air to the second outlet.

15 Claims, 11 Drawing Sheets

FOREIGN PATENT DOCUMENTS

| JP | 08-263162 | 10/1996 |
| JP | 08-263162 A | 10/1996 |
| JP | 10-093274 | 4/1998 |
| JP | 10-093274 A | 4/1998 |
| JP | 2005-276920 A | 10/2005 |
| JP | 2006-054215 | 2/2006 |
| JP | 2006-054215 A | 2/2006 |

* cited by examiner

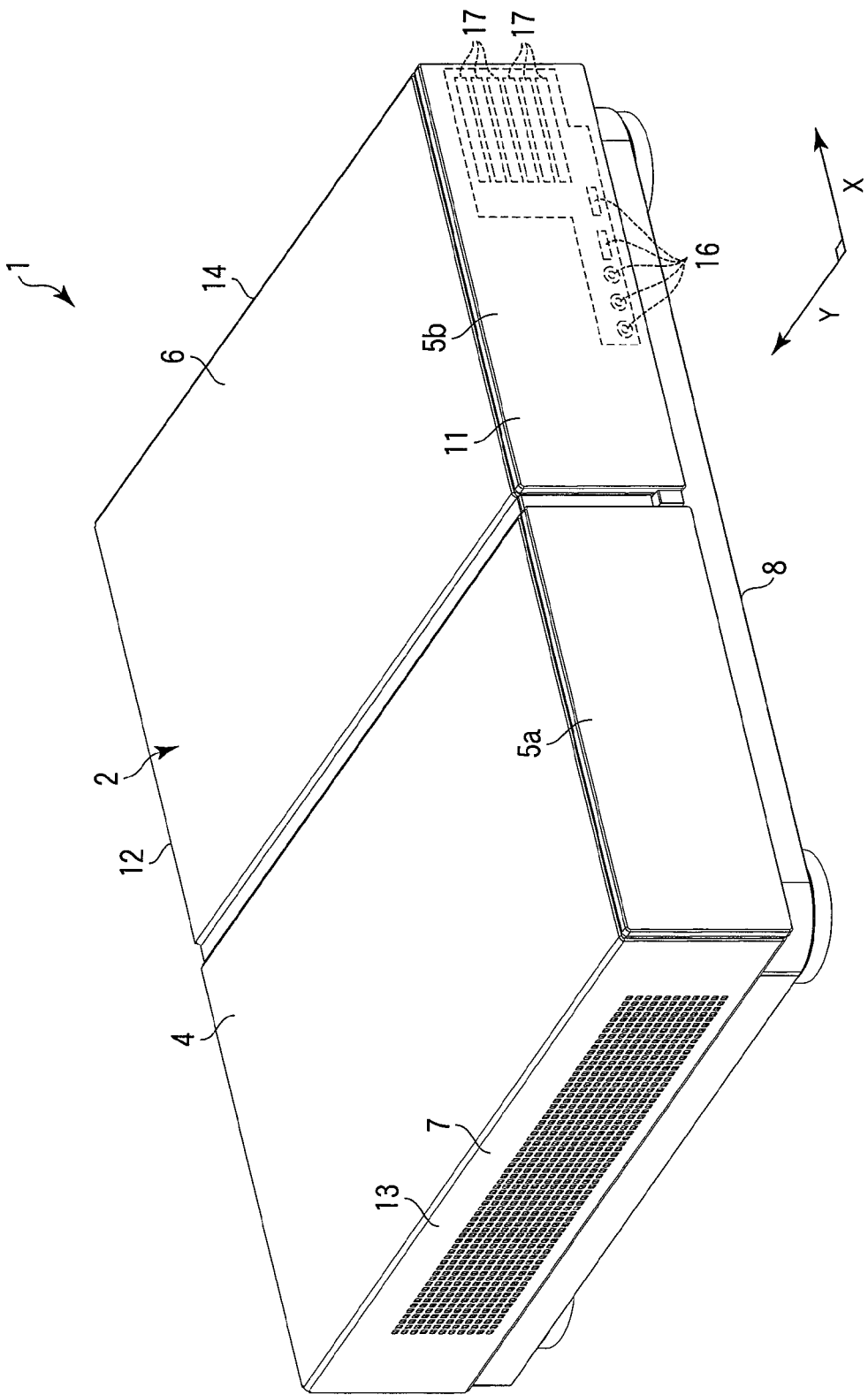
F I G. 1

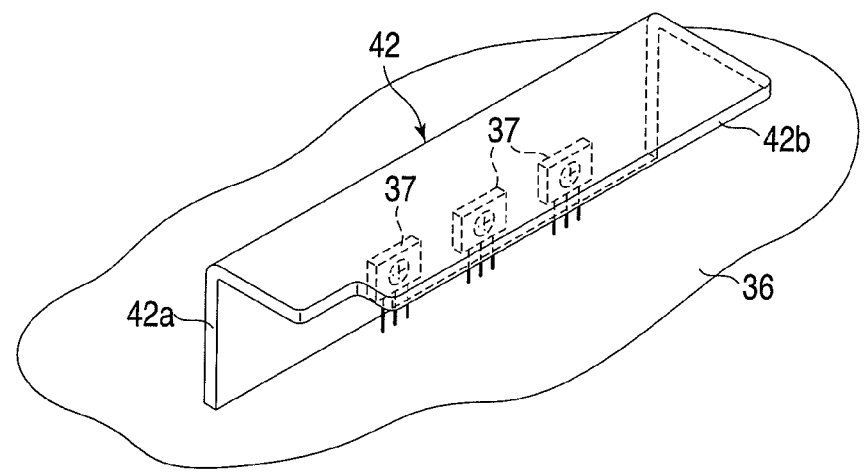
F I G. 10
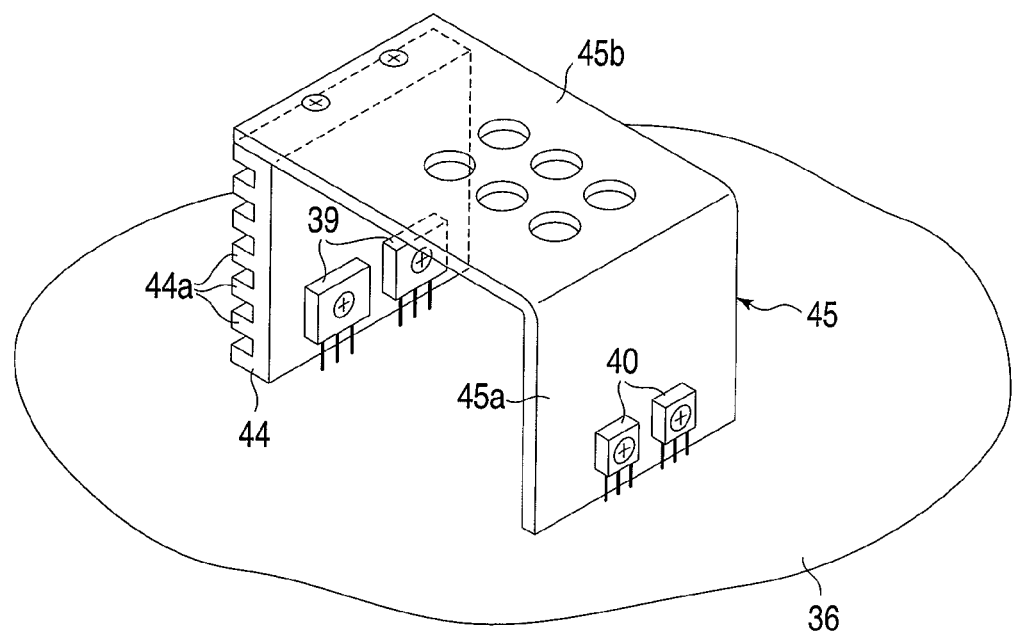
F I G. 11

ELECTRONIC APPARATUS

CROSS-REFERENCE TO RELATED APPLICATION

This application is based upon and claims the benefit of priority from Japanese Patent Application No. 2009-228134, filed Sep. 30, 2009; the entire contents of which are incorporated herein by reference.

FIELD

Embodiments described herein relate generally to an electronic apparatus comprising a cooling structure.

BACKGROUND

In recent years, the amount of heat emitted from heating elements mounted on an electronic apparatus has tended to increase. Therefore, it is necessary to improve the cooling efficiency of the electronic apparatus. Jpn. Pat. Appln. KOKAI Publication No. 6-125187 discloses an electronic apparatus in which a partition is provided in a housing. The electronic apparatus includes cooling fans that are provided on two flow paths partitioned by the partition.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is an exemplary perspective view illustrating a television connecting apparatus according to an embodiment of the invention;

FIG. 10 is an exemplary perspective view illustrating a heat sink shown in FIG. 4;

FIG. 11 is an exemplary perspective view illustrating a heat radiator shown in FIG. 4.

DETAILED DESCRIPTION

Figure 2:
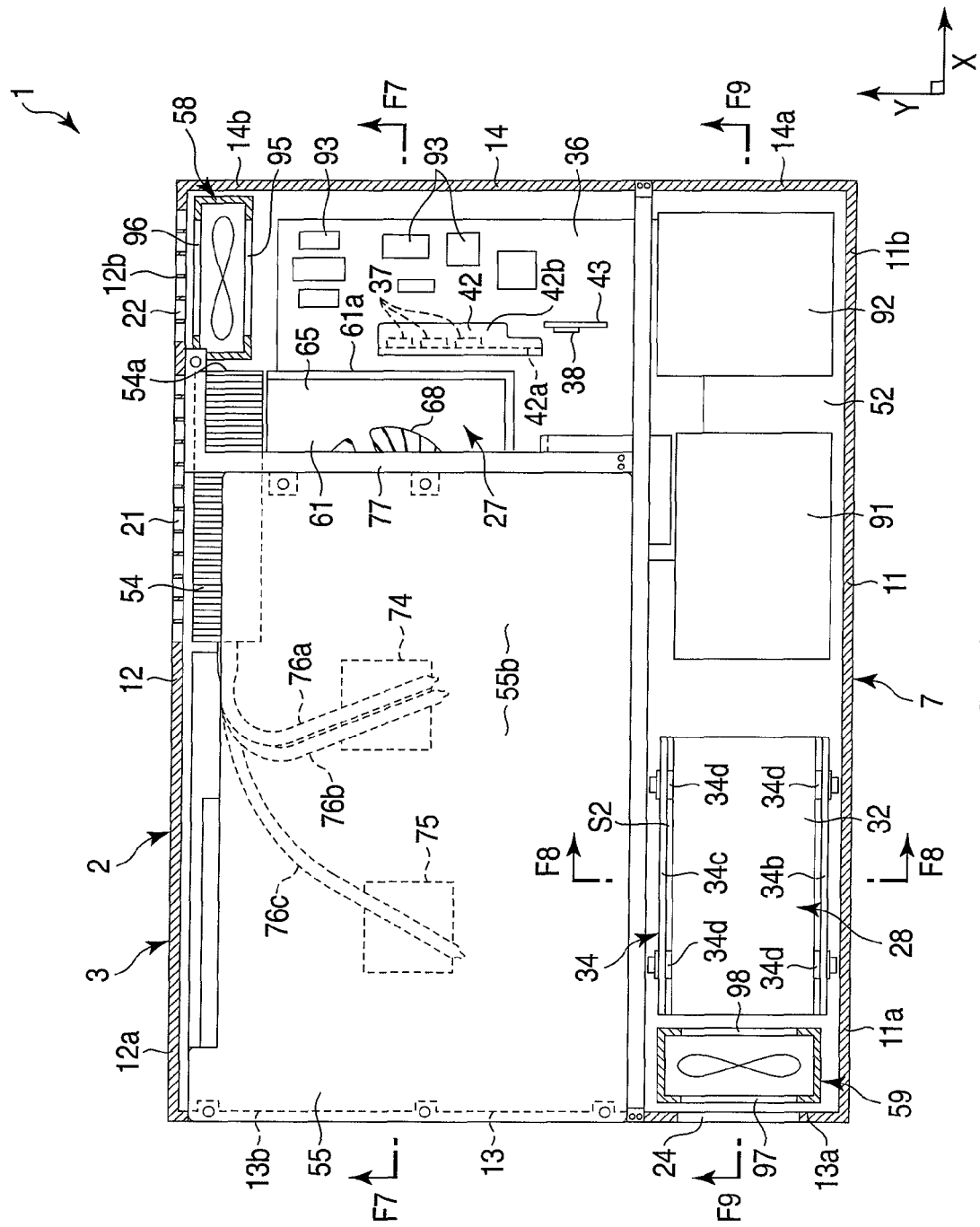
FIG. 2 is an exemplary cross-sectional view illustrating the internal structure of the television connecting apparatus shown in FIG. 1.

Various embodiments will be described hereinafter with reference to the accompanying drawings. In general, according to one embodiment, an electronic apparatus comprises: a housing; a first heating element; a heat sink; a storage module; a partition; a first cooling fan; and a second cooling fan. The housing comprises a first wall, a second wall opposite to the first wall and comprising a first outlet and a second outlet, a third wall extending between an edge portion of the first wall and an edge portion of the second wall and comprising a first inlet and a second inlet, and a bottom wall comprising a third inlet. The first heating element is contained in the housing. The heat sink is thermally connected to the first heating element and faces the first outlet. The storage module is provided along the front wall in the housing. The partition partitions an inside of the housing into a first chamber and a second chamber. The first chamber communicates with the first inlet, the third inlet, and the first outlet and contains the first heating element. The second chamber communicates with the second inlet and the second outlet and contains the storage module. The first cooling fan locates above the third inlet in the first chamber, and comprises a first intake configured to draw air in the first chamber, and a second intake configured to draw air outside the housing through the third inlet, the first cooling fan being configured to discharge the air to the heat sink. The second cooling fan locates in the second chamber and is configured to draw air in the second chamber, and to discharge the air to the second outlet.

Hereinafter, exemplary embodiments of the invention will be described with reference to FIGS. 1 to 12.

FIG. 1 is a diagram illustrating a television connecting apparatus 1, which is an example of an electronic apparatus according to the invention. The television connecting apparatus 1 is connected to, for example, a liquid crystal television, and has a function of receiving various television programs, a function of recording a plurality of television programs at the same time, and a function of recording programs for a long time.

The television connecting apparatus 1 comprises, for example, a flat box-shaped housing 2. The housing 2 comprises a main case 3 and a decorative cover 4. The main case 3 is made of, for example, a metal material and has a box shape with the upper side open. The decorative cover 4 has a size larger than that of the main case 3 so as to cover the main case 3 and has a box shape with the lower side open. In this way, the decorative cover 4 is coupled to the main case 3 to form the housing 2. Front doors 5a and 5b are provided on the left and right sides of the front surface of the decorative cover 4 so as to be openable.

As shown in FIG. 1, the housing 2 comprises an upper wall 6, a circumferential wall 7, and a bottom wall 8. Each of the upper wall 6 and the bottom wall 8 extends in the horizontal direction. The circumferential wall 7 rises with respect to the bottom wall 8 and connects the edge portion of the bottom wall 8 and the edge portion of the upper wall 6. As shown in FIG. 2, the circumferential wall 7 comprises a front wall 11, a rear wall 12, a left wall 13, and a right wall 14.

The front wall 11 is an example of a first wall (first surface) according to the invention. The front wall 11 is a so-called user surface and faces a viewer of the television. The front wall 11 extends in the left-right direction (hereinafter, referred to as a first direction X). As shown in FIG. 1, connectors 16 into which various kinds of terminals are insertable or insertion holes 17 into which B-CAS (BS-Condition Access System) cards are insertable are provided in the front wall 11. As shown in FIG. 2, the front wall 11 comprises a first end portion 11a, which is a left end portion, and a second end portion 11b, which is a right end portion. The first end portion 11a is connected to the left wall 13. The second end portion 11b is connected to the right wall 14.

As shown in FIG. 2, the rear wall 12 is an example of a second wall (second surface) according to the invention. The rear wall 12 is disposed opposite to the front wall 11 in the housing 2. The rear wall 12 extends substantially in parallel to the front wall 11 (that is, in the first direction X). The rear wall 12 comprises a first end portion 12a, which is a left end portion, and a second end portion 12b, which is a right end portion. The first end portion 12a is connected to the left wall 13. The second end portion 12b is connected to the right wall 14.

The rear wall 12 comprises first and second outlets 21 and 22. As shown in FIG. 2, the second outlets 22 are provided at the second end portion 12b of the rear wall 12. The first outlets 21 are provided in a region of the rear wall 12 adjacent to the second end portion 12b, for example, at a position leaning to the right side from the center of the rear wall 12. For example, the first outlets 21 are provided in larger area than the second outlets 22 are.

As shown in FIG. 2, the left wall 13 is an example of a third wall (third surface) according to the invention and is also an example of a first side wall according to the invention. The left wall 13 extends in the front-rear direction (hereinafter, referred to as a second direction Y) of the housing 2 between the left edge portion of the front wall 11 and the left edge portion of the rear wall 12. The first and second directions X and Y are orthogonal to each other. The left wall 13 comprises a first end portion 13a, which is the front end portion, and a second end portion 13b, which is a rear end portion. The first end portion 13a is connected to the front wall 11. The second end portion 13b is connected to the rear wall 12.

The left wall 13 comprises first and second inlets 23 and 24. The second inlet 24 is provided at the first end portion 13a of the left wall 13. The first inlet 23 is provided closer to the rear wall 12 than the second inlet 24. For example, the first inlet 23 is larger than the second inlet 24.

As shown in FIG. 2, the right wall 14 is an example of a fourth wall (fourth surface) according to the invention and is also an example of a second side wall according to the invention. The right wall 14 is provided opposite to the left wall 13 in the housing 2. The right wall 14 extends in the front-rear direction of the housing 2 between the right edge portion of the front wall 11 and the right edge portion of the rear wall 12. The right wall 14 comprises a first end portion 14a, which is the front end portion, and a second end portion 14b, which is a rear end portion. The first end portion 14a is connected to the front wall 11. The second end portion 14b is connected to the rear wall 12.

No inlet or outlet is provided in the front wall 11 and the right wall 14. That is, in the television connecting apparatus 1 according to this embodiment, all the inlets are provided only in the left wall 13 of the circumferential wall 7. In addition, all the outlets are provided only in the rear wall 12.

Figure 5:
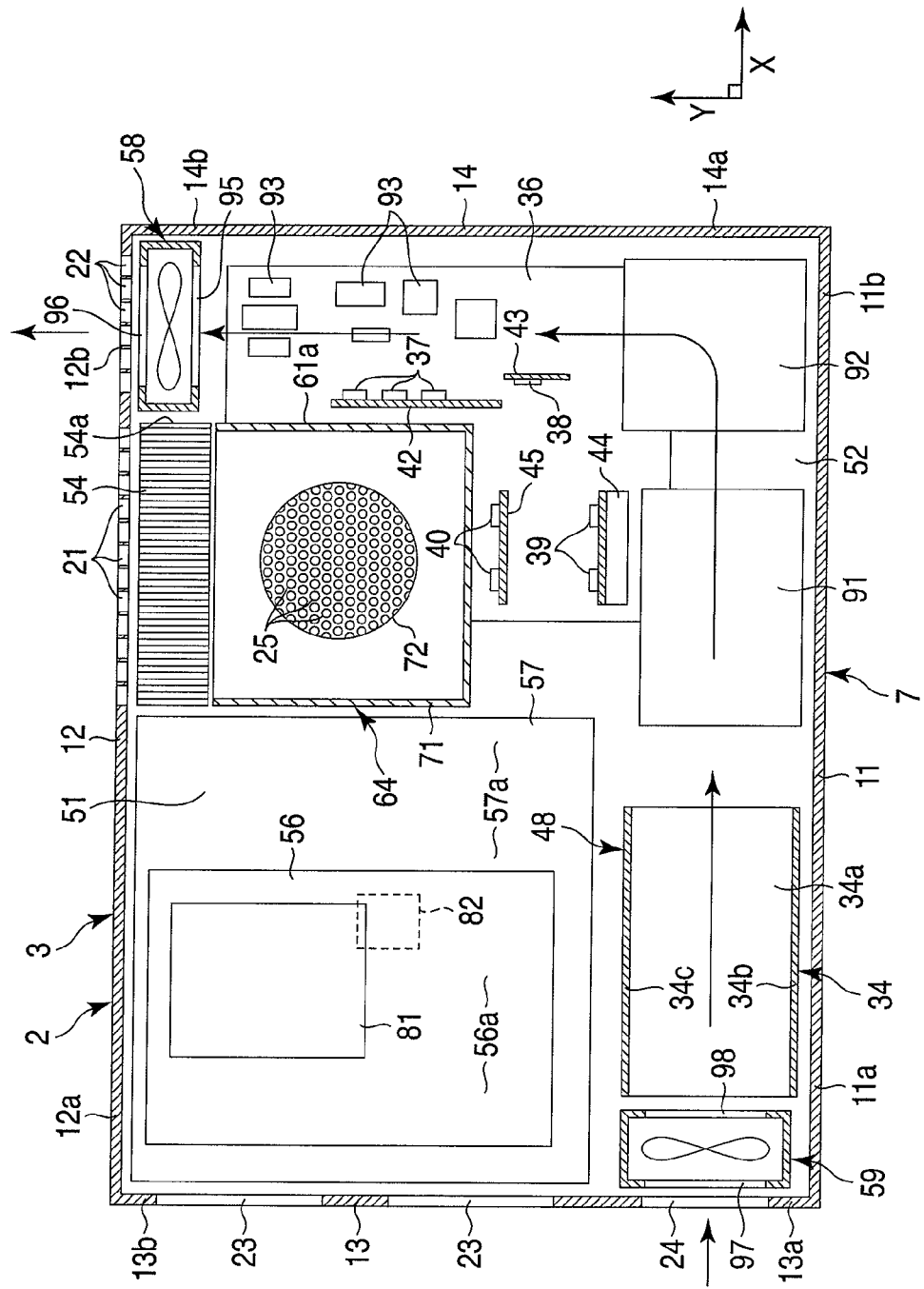
FIG. 5 is an exemplary cross-sectional view illustrating the internal structure of the television connecting apparatus shown in FIG. 1.
Figure 7:
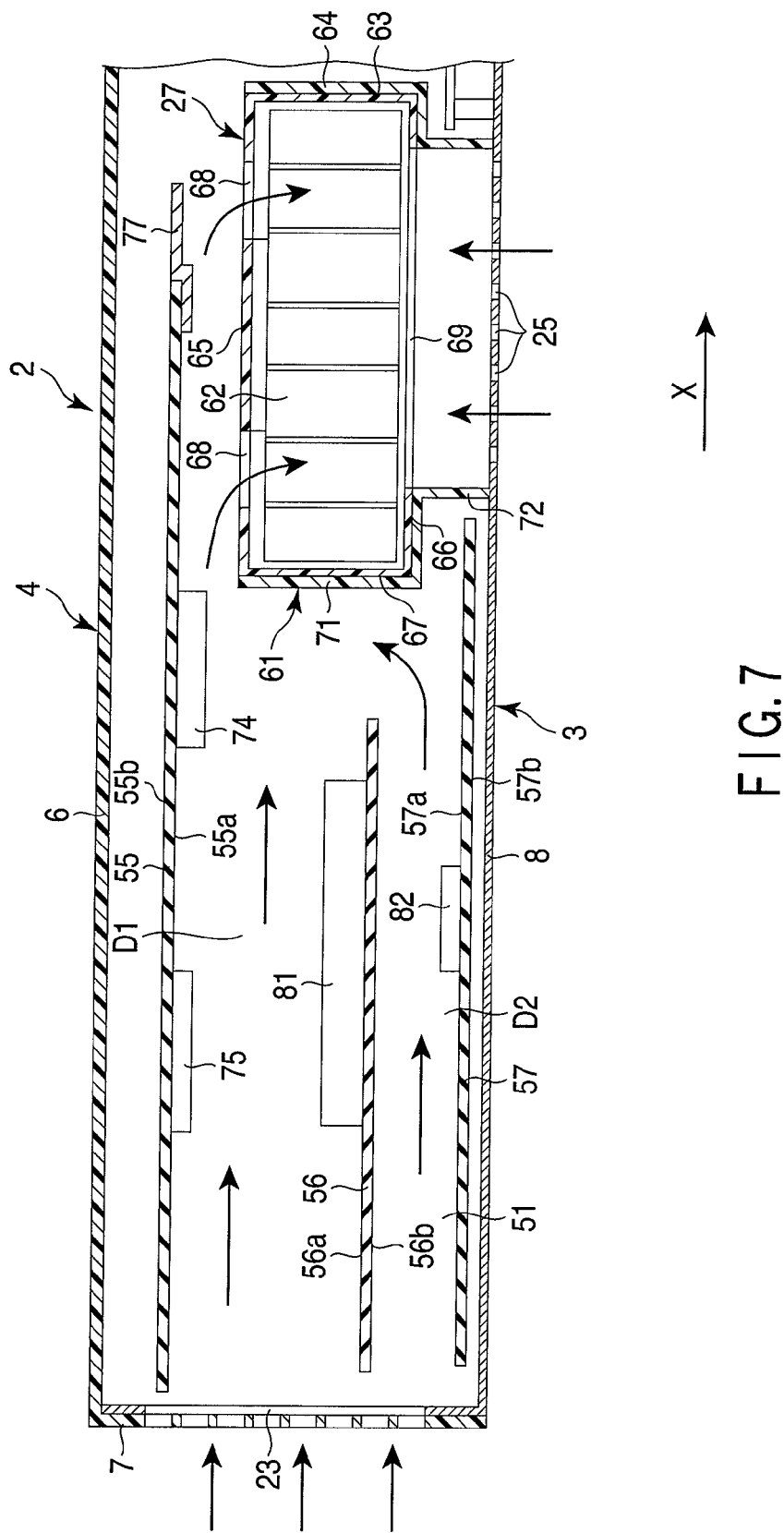
FIG. 7 is an exemplary cross-sectional view illustrating the television connecting apparatus taken along the line F7-F7 of FIG. 2.

As shown in FIGS. 5 and 7, third inlets 25 are provided in the bottom wall 8. The third inlets 25 are provided below a first cooling fan 27, which will be described below. No outlet is provided in the bottom wall 8. In addition, no inlet or outlet is provided in the upper wall 6.

Figure 6:
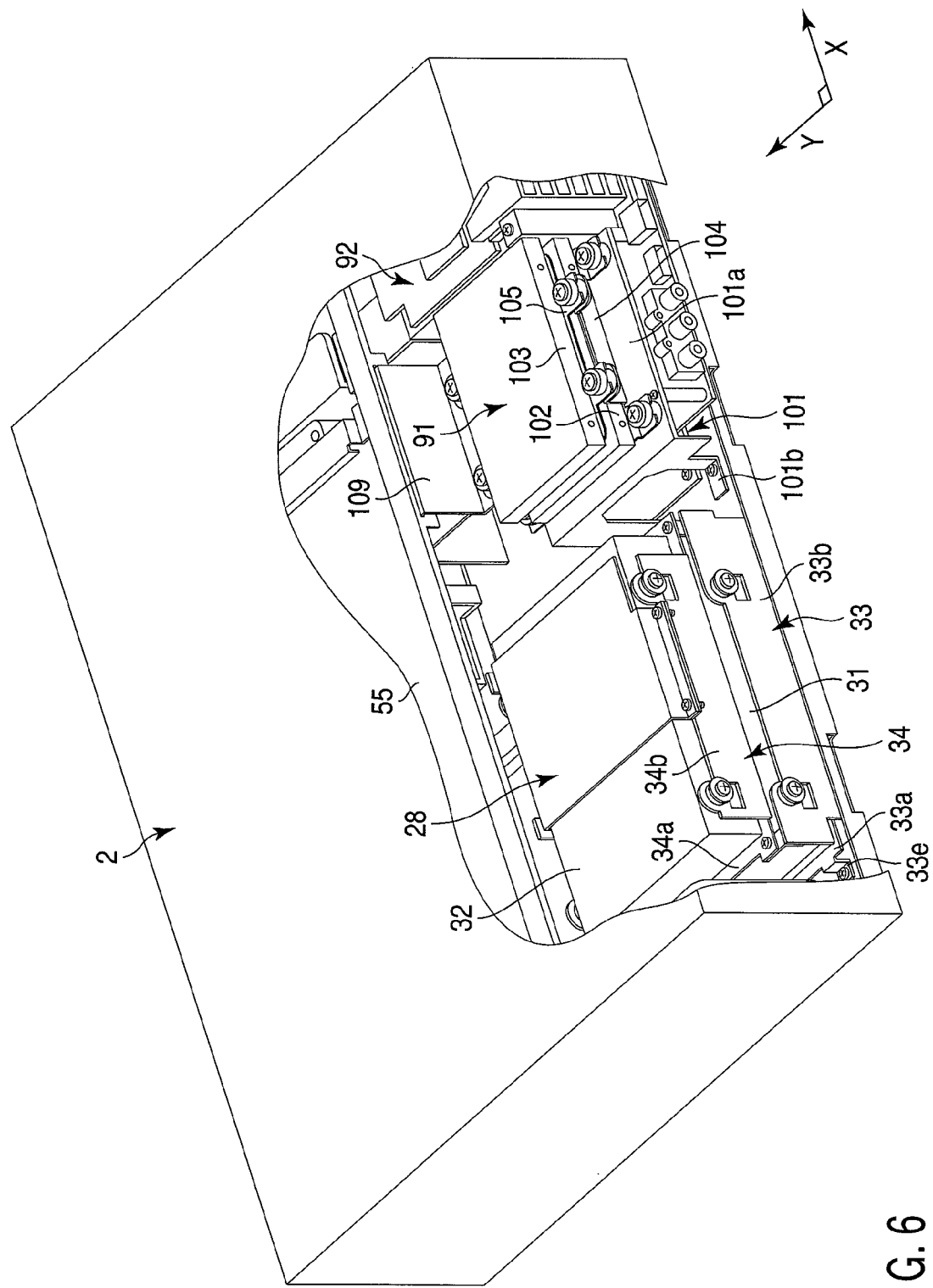
FIG. 6 is an exemplary perspective view illustrating the internal structure of the television connecting apparatus shown in FIG. 1.
Figure 8:
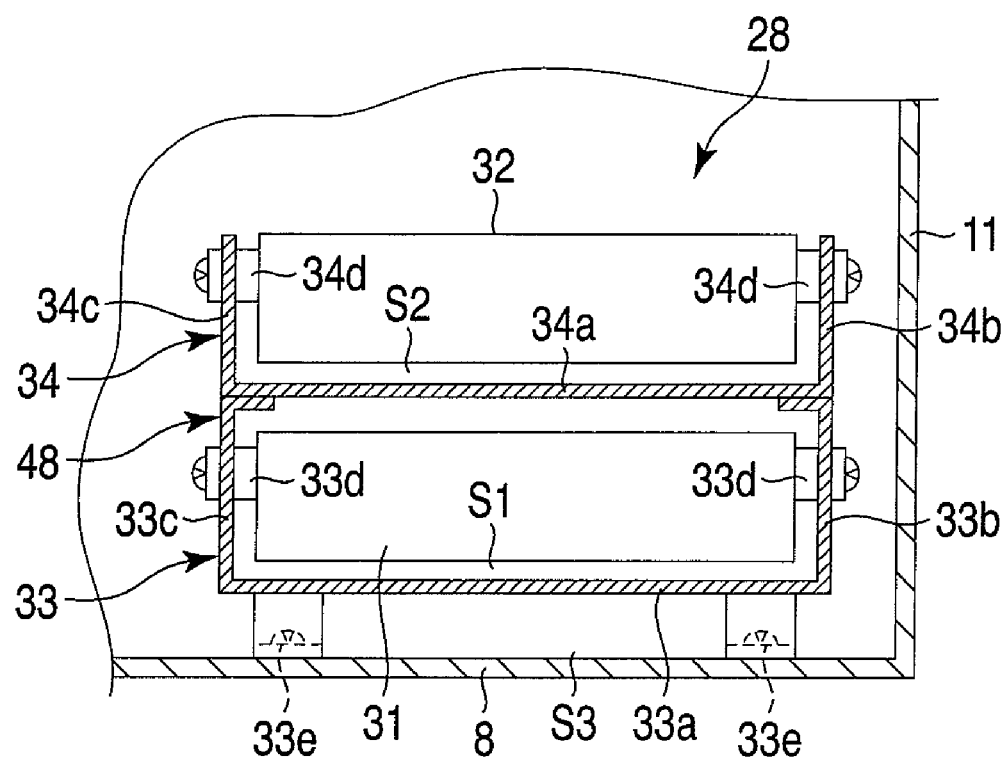
FIG. 8 is an exemplary cross-sectional view illustrating the television connecting apparatus taken along the line F8-F8 of FIG. 2.

As shown in FIGS. 2 and 6, the housing 2 comprises a first HDD unit 28. As shown in FIG. 8, the first HDD unit 28 comprises first and second HDDs 31 and 32 and first and second holders 33 and 34. The first holder 33 holds the first HDD 31. The second holder 34 holds the second HDD 32 and is stacked on the first holder 33. In this way, the first and second HDDs 31 and 32 are held so as to overlap each other in the vertical direction.

Each of the first and second HDDs 31 and 32 is an example of a "storage module" according to the invention. The first and second HDDs 31 and 32 are arranged along the front wall 11 of the housing 2. The first and second HDDs 31 and 32 each have a rectangular parallelepiped shape along the front wall 11 of the housing 2.

As shown in FIG. 8, the first holder 33 comprises a base portion 33a that extends below the first HDD 31 and first and second rising portions 33b and 33c that rise from both ends of the base portion 33a. For example, the first rising portion 33b faces the front wall 11 of the housing 2. The second rising portion 33c is provided opposite to the first rising portion 33b. The first and second rising portions 33b and 33c extend in the first direction X in parallel to the front wall 11.

As shown in FIG. 8, absorbers 33d are provided between the first and second rising portions 33b and 33c and the first HDD 31. The absorbers 33d are, for example, rubber dampers. In this way, vibration transmitted to the first HDD 31 is reduced. As shown in FIG. 8, the first HDD 31 is held in the first holder 33 so as to float therefrom. A gap S1 through which cooling air flows is formed between the first HDD 31 and the first holder 33.

Similarly, as shown in FIG. 8, the second holder 34 comprises a base portion 34a that extends below the second HDD 32 and first and second rising portions 34b and 34c that rise from both ends of the base portion 34a. For example, the first rising portion 34b faces the front wall 11 of the housing 2. The second rising portion 34c is provided opposite to the first rising portion 34b. As shown in FIGS. 2 and 6, the first and second rising portions 34b and 34c extend in the first direction X in parallel to the front wall 11.

Absorbers 34d are provided between the first and second rising portions 34b and 34c and the second HDD 32. The second HDD 32 is held in the second holder 34 so as to float therefrom. A gap S2 through which cooling air flows is formed between the second HDD 32 and the second holder 34.

Figure 4:
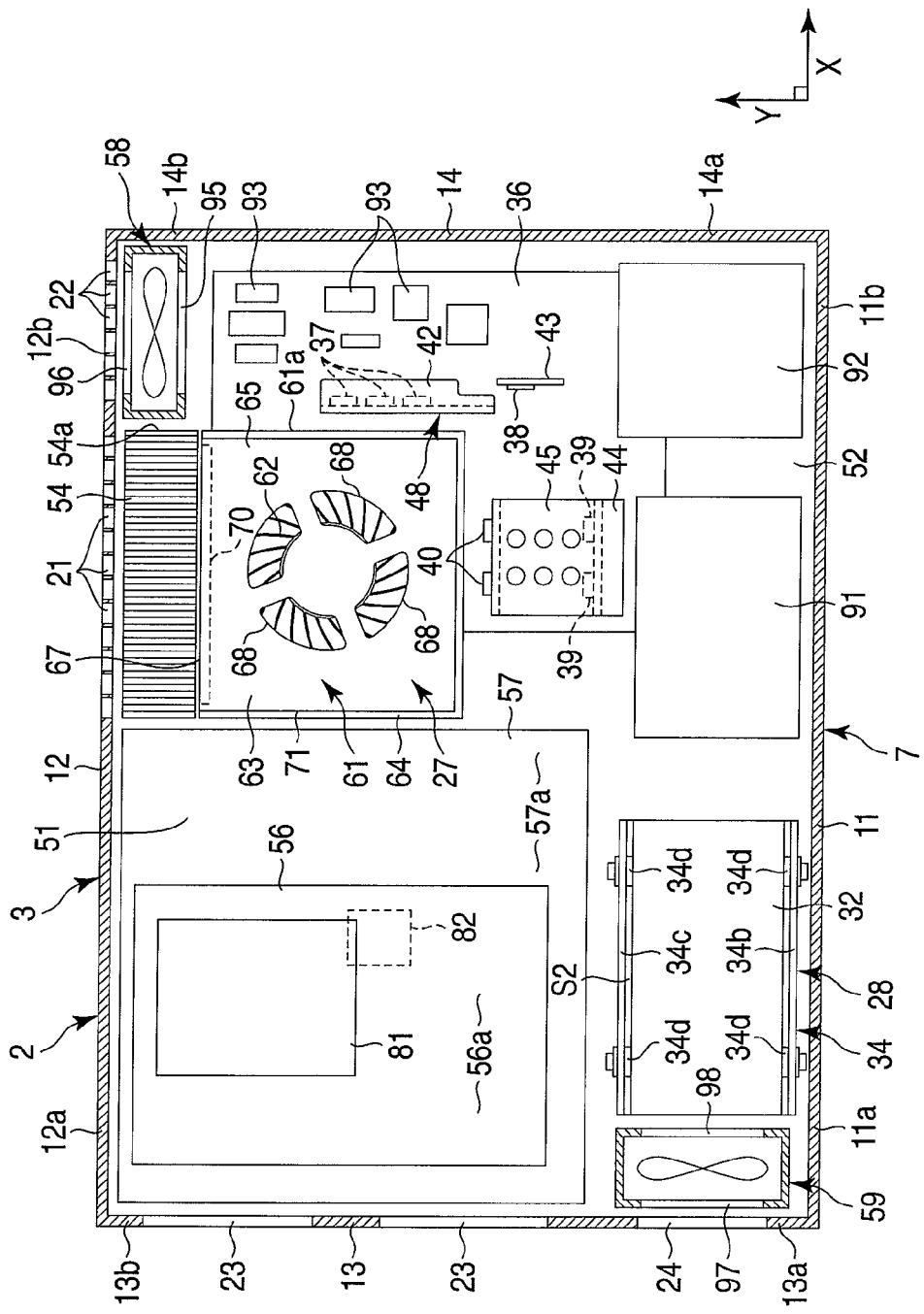
FIG. 4 is an exemplary cross-sectional view illustrating the internal structure of the television connecting apparatus shown in FIG. 1.

As shown in FIGS. 2 and 4, a power supply circuit board 36 is accommodated in the housing 2. The power supply circuit board 36 is arranged in the housing 2 so as to lean to the right wall 14. The power supply circuit board 36 has first to fourth electronic components 37, 38, 39, and 40 mounted thereon. The first to fourth electronic components 37, 38, 39, and 40 are, for example, transistors which are heating elements.

As shown in FIG. 2, for example, a plurality of first electronic components 37 is provided so as to extend in parallel to each other in the second direction Y. As shown in FIGS. 2 and 10, a first heat sink 42 made of a metal material is attached to the first electronic components 37. The first heat sink 42 is fixed to the power supply circuit board 36 by, for example, screws. The first heat sink 42 comprises a rising portion 42a that rises with respect to the power supply circuit board 36 and a bent portion 42b bent from the leading end of the rising portion 42a to the right wall 14 in the horizontal direction.

As shown in FIGS. 2 and 5, the first heat sink 42 extends in the second direction Y in parallel to the right wall 14. The first electronic components 37 are fixed to the first heat sink 42 by screws with grease interposed therebetween. In this way, the first electronic components 37 are thermally connected to the first heat sink 42.

As shown in FIG. 2, a second heat sink 43 made of a metal material is attached to the second electronic component 38. The second heat sink 43 is fixed to the power supply circuit board 36 by, for example, screws. The second heat sink 43 extends in the second direction Y in parallel to the right wall 14. Similar to the first electronic components 37, the second electronic component 38 is fixed to the second heat sink 43 by screws and is thermally connected to the second heat sink 43.

As shown in FIG. 4, the third electronic components 39 are arranged closer to the front wall 11 and the left wall 13 than the first and second electronic components 37 and 38 are. For example, a plurality of third electronic components 39 is provided so as to be parallel to each other in the first direction X. As shown in FIGS. 4 and 11, a heat radiator 44 (i.e., another heat sink) made of a metal material is attached to the third electronic components 39. The heat radiator 44 is fixed to the power supply circuit board 36 by, for example, screws.

The heat radiator 44 extends in the first direction X in parallel to the front wall 11. The heat radiator 44 comprises a plurality of convex portions 44a that extends in the first direction X, and has a large radiation area. Similar to the first electronic components 37, the third electronic components 39 are fixed to the heat radiator 44 by screws and thermally connected to the heat radiator 44.

As shown in FIG. 4, similar to the third electronic components 39, the fourth electronic components 40 are arranged closer to the front wall 11 and the left wall 13 than the first electronic components 37. For example, a plurality of fourth electronic components 40 extends in parallel to each other in the first direction X. As shown in FIGS. 4 and 11, a third heat sink 45 made of a metal material is attached to the fourth electronic components 40. The third heat sink 45 is fixed to the power supply circuit board 36 by, for example, screws.

The third heat sink 45 comprises a rising portion 45a that rises with respect to the power supply circuit board 36 and a bent portion 45b bent from the leading end of the rising portion 45a to the front wall 11 in the horizontal direction and connected to the heat radiator 44. The third heat sink 45 is thermally connected to the heat radiator 44.

As shown in FIGS. 4 and 11, the third heat sink 45 extends in the first direction X in parallel to the front wall 11. Similar to the first electronic components 37, the fourth electronic components 40 are fixed to the third heat sink 45 by, for example, screws and are thermally connected to the third heat sink 45.

As described above, the rising portions 33c and 34c of the first and second holders 33 and 34 and the heat radiator 44 extend in the first direction X in the housing 2. In addition, the first and second heat sinks 42 and 43 extend in the second direction Y. A partition 48 is formed by these members 33c, 34c, 42, 43, and 44. As schematically shown in FIG. 12, the inside of the housing 2 is substantially partitioned into two chambers 51 and 52.

The first chamber 51 is defined by a portion of the left wall 13, a portion of the rear wall 12, the rising portions 33c and 34c of the first and second holders 33 and 34, the first and second heat sinks 42 and 43, and the heat radiator 44 and has a substantially rectangular shape. The second chamber 52 is defined by the front wall 11, the right wall 14, the rising portions 33c and 34c of the first and second holders 33 and 34, the first and second heat sinks 42 and 43, and the heat radiator 44 and has a substantially L shape along the front wall 11 and the right wall 14.

Next, the mounting structure of the first chamber 51 will be described first.

Figure 12:
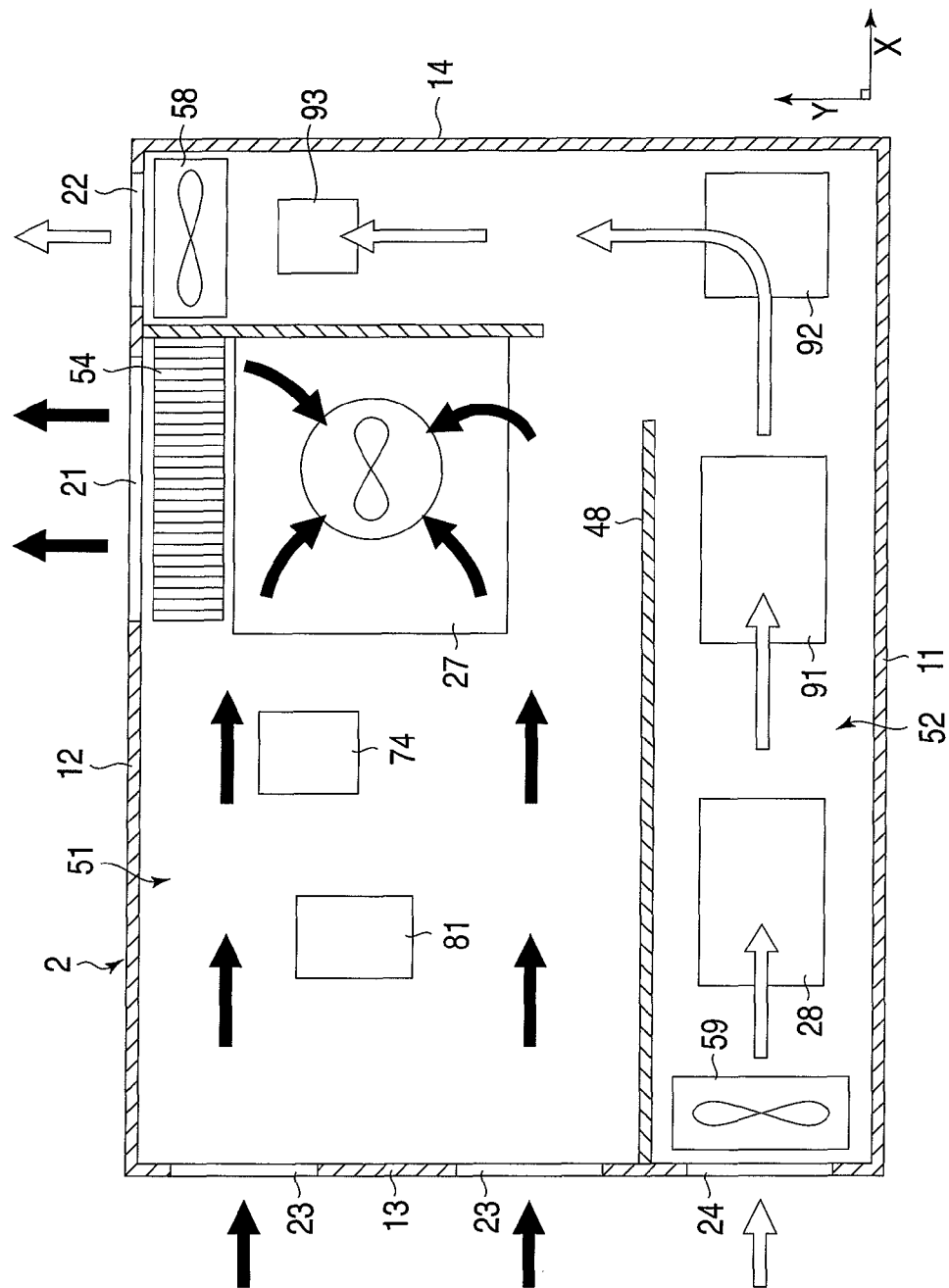
FIG. 12 is an exemplary cross-sectional view schematically illustrating the internal structure of the television connecting apparatus shown in FIG. 5.

As shown in FIGS. 2, 4, and 12, the first chamber 51 communicates with the first inlets 23, the third inlets 25, and the first outlets 21. A heat sink 54, the first cooling fan 27, a cell board 55 (main board), a tuner board 56, and an image processing board 57 are arranged in the first chamber 51. As shown in FIG. 7, the cell board 55 (main board), the tuner board 56, and the image processing board 57 are arranged so as to overlap each other.

FIG. 2 shows the internal structure of the housing 2 with the cell board 55 mounted thereon. FIG. 4 shows the internal structure of the housing 2 with the cell board 55 removed. FIG. 5 shows the internal structure of the housing 2 with the first cooling fan 27 removed. In addition, for convenience of description, FIG. 5 shows the cross section of members forming the partition 48.

As shown in FIG. 4, the heat sink 54 and the first cooling fan 27 are arranged above the third inlets 25 on the rightmost side of the first chamber 51. The heat sink 54 is disposed between the first cooling fan 27 and the first outlets 21 so as to face the first outlets 21. The heat sink 54 is a fin unit having a plurality of fins.

The first cooling fan 27 is a double-sided centrifugal fan. The first cooling fan 27 is larger than second and third cooling fans 58 and 59, which will be described below, and has a good cooling function. As shown in FIG. 7, the first cooling fan 27 comprises a fan case 61 and an impeller 62. The impeller 62 is accommodated in the fan case 61 and is rotated. The fan case 61 includes an inner case 63 and an outer case 64.

The inner case 63 comprises an upper surface 65, a lower surface 66, and a side surface 67. The upper surface 65 comprises first intakes 68. The lower surface 66 comprises a second intake 69. As shown in FIG. 4, the side surface 67 comprises a discharge hole 70 formed therein. The discharge hole 70 faces the heat sink 54. The first cooling fan 27 draws air through the first and second intakes 68 and 69 and discharges the drawn air through the discharge hole 70.

The outer case 64 comprises a holding portion 71 and a duct portion 72. The holding portion 71 is larger than the inner case 63 and has a box shape with the upper and rear sides open. The inner case 63 is provided in the holding portion 71. In this way, the first intakes 68 and the discharge hole 70 are opened in the housing 2 (in the first chamber 51). The first cooling fan 27 draws air in the first chamber 51 through the first inlets 68.

The duct portion 72 is provided between the holding portion 71 and the bottom wall 8 of the housing 2. The duct portion 72 has a cylindrical shape and surrounds the third inlets 25. The second intake 69 of the first cooling fan 27 communicates with the third inlets 25 formed in the bottom wall 8 of the housing 2 through the duct portion 72. In other words, the second intake 69 is isolated from the inside of the housing 2 by the outer case 64 so as not to draw air in the housing 2 (air in the first chamber 51). Air outside the housing 2 is drawn into the second intake 69 of the first cooling fan 27 through the third inlets 25 formed in the bottom wall 8 of the housing 2.

That is, the first cooling fan 27 draws air in the first chamber 51 and also draws air outside the housing 2 through the third inlets 25. In addition, the first cooling fan 27 discharges the air to the heat sink 54.

As shown in FIGS. 2 and 5, a right surface 54a of the heat sink 54 and a right surface 61a of the fan case 61 of the first cooling fan 27 extend in the second direction Y in parallel to the right wall 14. The right surface 54a of the heat sink 54 and the right surface 61a of the fan case 61 of the first cooling fan 27 form a portion of the partition 48.

Figure 3:
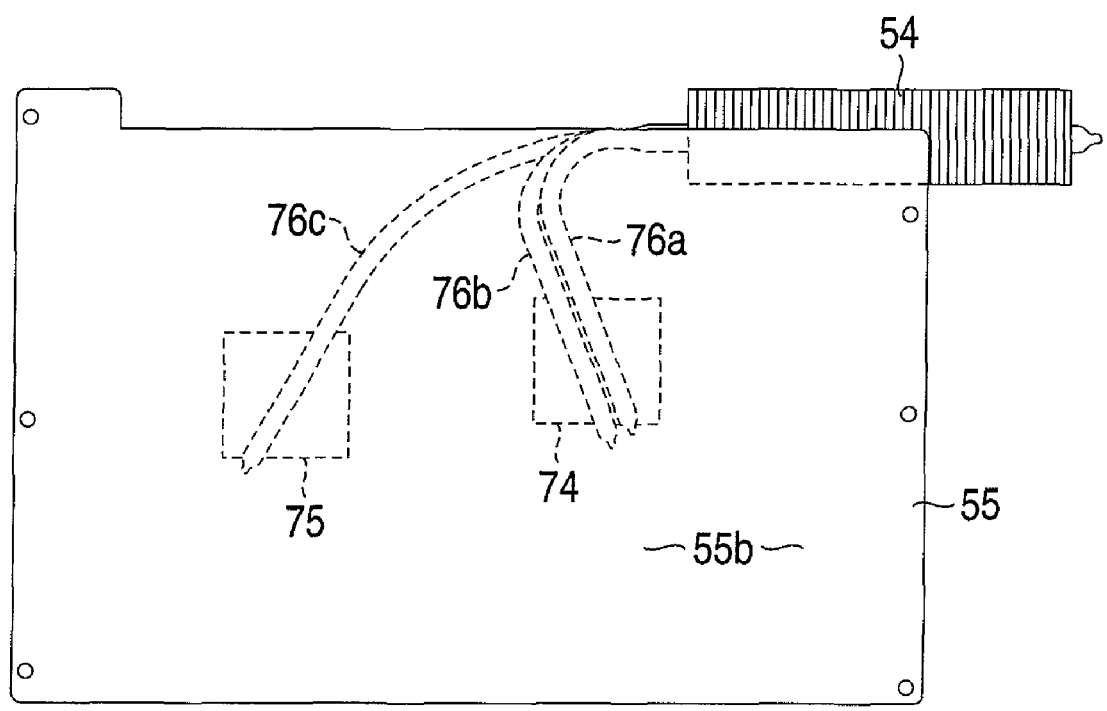
FIG. 3 is an exemplary plan view illustrating a cell board shown in FIG. 2.

FIG. 3 shows the cell board 55. The cell board 55 is an example of a first circuit board according to the invention. The cell board 55 has a cell processor 74 and an I/O controller 75 mounted thereon. The cell processor 74 is an example of a first heating element according to the invention. The cell processor 74 consumes a power of about 50 W and emits the largest amount of heat in the television connecting apparatus 1. The I/O controller 75 consumes a power of about 15 W. The cell board 55 is a circuit board that consumes a total power of about 100 W and emits the largest amount of heat in the television connecting apparatus 1. The cell processor 74 and the I/O controller 75 are thermally connected to the heat sink 54 by heat pipes 76a, 76b, and 76c.

As shown in FIG. 7, the cell board 55 is disposed at the highest position among the three boards 55, 56, and 57. The cell board 55 is disposed above the first cooling fan 27. The cell board 55 faces at least some of the first intakes 68 of the first cooling fan 27. The cell board 55 extends between the first outlets 21 and the first intake 68 of the first cooling fan 27 and forms the ceiling of the first chamber 51.

As shown in FIG. 7, the cell board 55 comprises a first board surface 55a that faces the first cooling fan 27 and a second board surface 55b opposite to the first board surface 55a and faces the upper wall 6 of the housing 2. The first board surface 55a defines one side of a first air path D1 (main air guide path) that guides air from the first inlets 23 to the first cooling fan 27. That is, when the first cooling fan 27 is driven, cooling air flows along the first board surface 55a. The cell processor 74 and the I/O controller 75 are mounted on the first board surface 55a and are exposed to the cooling air.

A heating element larger than the cell processor 74 and the I/O controller 75 is not mounted on the second board surface 55b. That is, components that emit a large amount of heat and need to be actively cooled down are generally mounted on the first board surface 55a of the cell board 55.

As shown in FIGS. 2 and 7, a bracket 77 is provided which supports the end portion of the cell board 55. The bracket 77 is fixed to the housing 2, extends to the upper side of the first cooling fan 27, and faces the first intake 68 of the first cooling fan 27. The bracket 77 extends from the end portion of the cell board 55 to the side opposite to the first inlets 23. In this way, the first air path D1 is extended.

The tuner board 56 is an example of a second circuit board according to the invention. A tuner 81 is mounted on the tuner board 56. The tuner 81 is an example of a second heating element according to the invention. The amount of heat emitted from the tuner 81 is less than that of heat emitted from the cell processor 74 (first heating element). The tuner board 56 is disposed in the middle among the three circuit boards 55, 56, and 57. The tuner board 56 faces the first cooling fan 27 in the horizontal direction.

The tuner board 56 comprises a first board surface 56a that faces the cell board 55 and a second board surface 56b opposite to the first board surface 56a and faces the image processing board 57. The first board surface 56a faces the cell board 55 with the first air path D1 interposed therebetween and defines the other side of the first air path D1. In other words, the gap between the cell board 55 and the tuner board 56 is the first air path D1. When the first cooling fan 27 is driven, the cooling air flows along the first board surface 56a. The tuner 81 is mounted on the first board surface 56a and is exposed to the cooling air.

A heating element larger than the tuner 81 is not mounted on the second board surface 56b. That is, components that emit a large amount of heat and need to be actively cooled down are generally mounted on the first board surface 56a of the tuner board 56.

The image processing board 57 is an example of a third circuit board according to the invention. An image processing chip 82 is mounted on the image processing board 57. The image processing chip 82 is an example of a third heating element according to the invention. The amount of heat emitted from the image processing chip 82 is less than that of heat emitted from the cell processor 74 (first heating element) or the tuner (second heating element). The image processing board 57 is disposed at the lowest position among the three circuit boards 55, 56, and 57. That is, the image processing board 57 is disposed opposite to the cell board 55 with the tuner board 56 interposed therebetween.

The image processing board 57 comprises a first board surface 57a that faces the tuner board 56 and a second board surface 57b opposite to the first board surface 57a and facing the bottom wall 8 of the housing 2. The gap between the first board surface 57a of the image processing board 57 and the second board surface 56b of the tuner board 56 is a second air path D2 (sub air guide path) that guides air from the first inlets 23 to the first cooling fan 27. The image processing chip 82 is mounted on the first board surface 57a and is exposed to cooling air flowing through the second air path D2.

Since the first air path D1 is closer to the first intake 68 of the first cooling fan 27 than the second air path D2, the amount of air flowing through the first air path D1 is larger than that of air flowing through the second air path D2. That is, in this embodiment, the three circuit boards 55, 56, and 57 are sequentially arranged from the upper side in descending order of temperature and two circuit boards 55 and 56 emitting a large amount of heat face the first air path D1.

Next, the mounting structure of the second chamber 52 will be described.

As shown in FIGS. 5 and 12, the second chamber 52 communicates with the second inlet 24 and the second outlet 22. The second and third cooling fans 58 and 59, the first HDD unit 28, a second HDD unit 91, a B-CAS unit 92, and a power supply circuit part 93 are arranged in the second chamber 52.

The amount of heat emitted from each of the first HDD unit 28, the second HDD unit 91, the B-CAS unit 92, and the power supply circuit part 93 is less than that of heat emitted from the cell processor 74 or the tuner 81. The first HDD unit 28, the second HDD unit 91, the B-CAS unit 92, and the power supply circuit part 93 have low heat resistance as compared to the cell processor 74 or the tuner 81. The second and third cooling fans 58 and 59 are axial-flow fans. The second and third cooling fans 58 and 59 are smaller than the first cooling fan 27 and have low cooling efficiency.

As shown in FIGS. 5 and 12, the second cooling fan 58 faces the second outlet 22. The second cooling fan 58 comprises an intake 95 opened in the second chamber 52 and a discharge hole 96 that faces the second outlet 22. The second cooling fan 58 draws air in the second chamber 52, discharges the drawn air to the second outlet 22, and exhausts the air to the outside of the housing 2.

The third cooling fan 59 faces the second inlet 24. The third cooling fan 59 comprises an intake 97 that faces the second inlet 24 and a discharge hole 98 opened in the second chamber 52.

The third cooling fan 59 draws air from the outside of the housing 2 through the second inlet 24 and discharges the drawn air into the second chamber 52. In this way, in the second chamber 52, cooling air flows in an L shape along the front wall 11 and the right wall 14.

Figure 9:
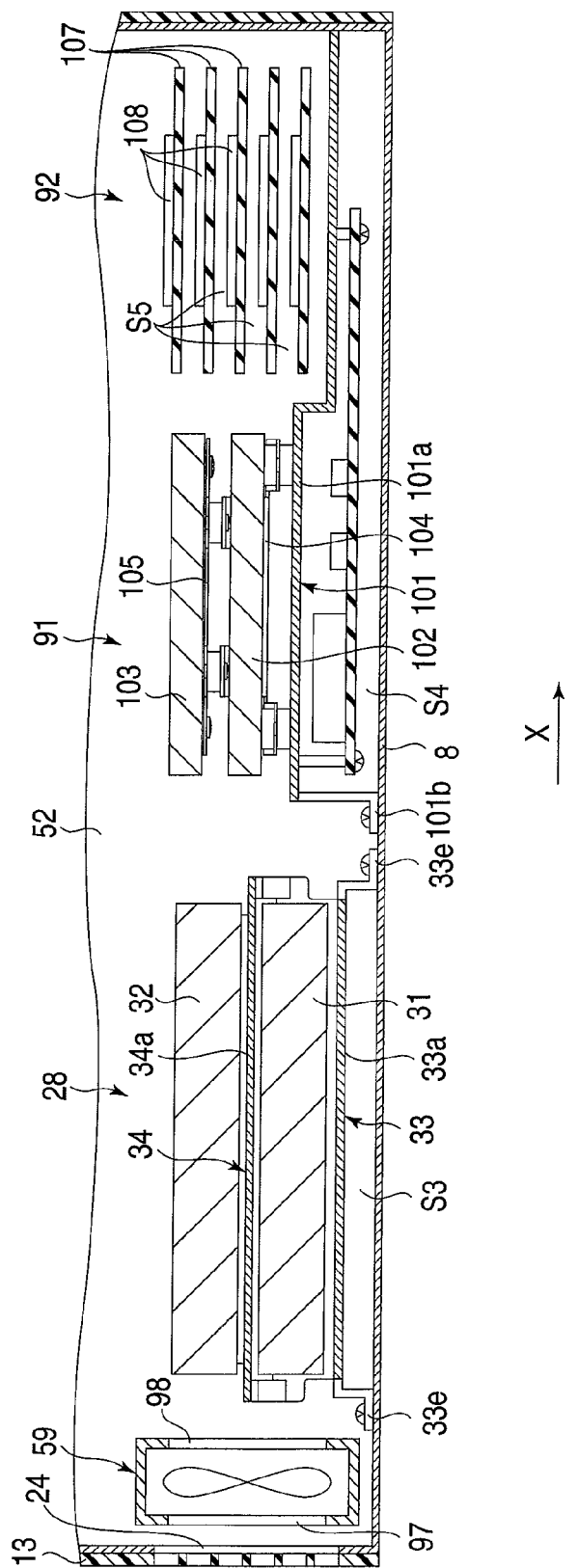
FIG. 9 is an exemplary cross-sectional view illustrating the television connecting apparatus taken along the line F9-F9 of FIG. 2.

As shown in FIGS. 8 and 9, the first holder 33 of the first HDD unit 28 comprises legs 33e and holds the base portion 33a such that the base portion 33a floats from the bottom wall 8 of the housing 2. In this way, a gap S3 through which the cooling air flows is formed between the first HDD 31 and the bottom wall 8 of the housing 2.

As shown in FIGS. 6 and 9, the second HDD unit 91 comprises a supporting table 101, third and fourth HDDs 102 and 103, and third and fourth holders 104 and 105. The supporting table 101 comprises a ceiling 101a that extends in the horizontal direction and legs 101b that support the ceiling 101a. In this way, a gap S4 through which the cooling air flows is formed between the ceiling 101a of the supporting table 101 and the bottom wall 8 of the housing 2.

The third holder 104 holds the third HDD 102. The fourth holder 105 holds the fourth HDD 103 and is stacked on the third holder 104. In this way, the third and fourth HDDs 102 and 103 are held so as to overlap each other in the vertical direction.

Each of the third and fourth HDDs 102 and 103 is an example of the "storage module" according to the invention, and is arranged along the front wall 11 of the housing 2. The third and fourth HDDs 102 and 103 each have a rectangular parallelepiped shape along the front wall 11 of the housing 2.

The B-CAS unit 92 receives and holds a B-CAS card required for a television to receive, for example, terrestrial digital broadcast signals, BS digital broadcast signals, and CS digital broadcast signals. The B-CAS unit 92 according to this embodiment comprises a plurality of circuit boards 107 stacked to each other. Each of the plurality of circuit boards 107 comprises a connector 108 into which the B-CAS card is inserted. A gap S5 through which the cooling air flows is formed between the plurality of circuit boards 107.

As shown in FIG. 5, the power supply circuit part 93 is mounted on the power supply circuit board 36. For example, the power supply circuit part 93 is arranged between the first heat sink 42 and the right wall 14.

As shown in FIG. 6, a film-shaped insulator 109 is provided above the heat radiator 44. The insulator 109 is vertically provided and extends in the first direction X. The insulator 109 forms a portion of the partition 48. As shown in FIG. 5, the third heat sink 45 forms a portion of the partition 48 and cuts some of the flow of air from the first chamber 51 to the second chamber 52.

Next, the operation of the television connecting apparatus 1 will be described.

In the television connecting apparatus 1 having the above-mentioned structure, the cell processor 74 and the tuner 81 emitting a large amount of heat are accommodated in the first chamber 51. Other electronic components with low heat resistance, such as the HDDs 31, 32, 102, and 103, are accommodated in the second chamber 52. The partition 48 is provided between the first and second chambers 51 and 52 to suppress flowing heated air from the first chamber 51 to the second chamber 52.

In this way, heat emitted from a heating element is hardly transmitted to electronic components with low heat resistance. That is, it is possible to reduce thermal connection between electronic components with low heat resistance and a heating element emitting a large amount of heat and thus suppress a reduction in the performance of the electronic components with low heat resistance.

The first cooling fan 27 with a good cooling function is arranged in the first chamber 51. The first cooling fan 27 draws air in the first chamber 51 through the first intakes 68, thereby drawing air from the outside of the housing 2 into the first chamber 51 through the first inlet 23. The drawn air flows through the first and second air paths D1 and D2 to radiate heat generated from the heating elements 74, 75, 81, and 82.

The first cooling fan 27 draws cold air (i.e., air not warmed) outside the housing 2 through the second intake 69. The air is discharged to the heat sink 54 to cool the heat sink 54. In this way, the cooling of the heating elements 74 and 75 is accelerated.

In the second chamber 52, the second and third cooling fans 58 and 59 draw cooling air in an L shape along the front wall 11 and the right wall 14. The cooling air passes through the first and second HDD units 28 and 91, the B-CAS unit 92, and the power supply circuit part 93 to cool these components 28, 91, 92, and 93.

When the gaps S3 and S4 are respectively formed below the first and second HDD units 28 and 91, the cooling air easily flows deep into the housing 2 having the B-CAS unit 92 accommodated therein through the gaps S3 and S4. When the gap S5 is formed between the plurality of circuit boards 107 of the B-CAS unit 92, the cooling air easily flows downward.

According to the television connecting apparatus 1 having the above-mentioned structure, it is possible to improve cooling efficiency. That is, since the partition 48 partitions the inside of the housing 2 into the first chamber 51 in which the cell processor 74 emitting a large amount of heat is accommodated and the second chamber 52 in which the HDDs 31, 32, 102, and 103 with low heat resistance are accommodated, it is possible to suppress the movement of heat between the first and second chambers 51 and 52. Since the cooling fans 27, 58, and 59 fitting the cooling conditions of the first and second chambers 51 and 52 are arranged in the first and second chambers 51 and 52, an efficient cooling that the excess and deficiency is few may be achieved as the entire apparatus.

The heat sink 54 thermally connected to the cell processor 74 emitting a large amount of heat is arranged in the first chamber 51. The first cooling fan 27 draws cold air (air not warmed in the housing 2) from the outside of the housing 2 and the heat sink 54 is cooled by the cold air. In this way, it is possible to effectively cool the heat sink 54.

Since the first cooling fan 27 draws air from the outside of the housing 2 through the second intake 69, a small amount of air is drawn into the housing 2, as compared to a structure in which a cooling fan with two intakes in the vertical direction opened in the housing 2 is provided. Therefore, for example, air may remain in the housing 2, as compared to the structure in which a cooling fan with two inlets in the vertical direction opened in the housing 2 is provided.

However, in this embodiment, the second chamber 52 in which components with low heat resistance are accommodated is separated from the first chamber 51 by the partition 48. In addition, air does not remain in the second chamber 52 by the cooling fans 58 and 59. Therefore, even when warm air remains in the first chamber 51, the components with low heat resistance are not affected easily by heat. As a result, in this embodiment, it is possible to use the cooling fan 27 which draws air from the outside of the housing 2 through the second intake 69 and thus intensively cool the heat sink 54 thermally connected to parts emitting a large amount of heat with cold air.

In the television connecting apparatus 1 according to this embodiment, all the exhaust holes (the first and second outlets 21 and 22) are formed only in the rear wall 12 of the housing 2. That is, since noise generated by the first and second cooling fans 27 and 58 is emitted from the rear wall 12 disposed opposite to the user, noise is less likely to reach the user. In this way, it is possible to achieve a silent television connecting apparatus 1.

The first chamber 51 in which the cell processor 74 emitting a large amount of heat is accommodated is provided close to the rear wall 12 and the second chamber 52 in which the HDDs 31 and 32 emitting a small amount of heat are accommodated is provided close to the user. In this way, it is possible to suppress an increase in the temperature of the front wall 11 which the user frequently accesses.

When the second chamber 52 has an L shape in which cooling air flows along the front wall 11 and the right wall 14, it is possible to ensure a relatively large second chamber 52 and accommodate a large number of parts in the second chamber 52. In addition, since the disturbance of air is less likely to occur, it is possible to improve cooling efficiency.

When the heat sinks 42 and 43 form a portion of the partition 48, it is possible to effectively use the inner space of the housing 2, as compared to a structure in which an inner wall or a rib is provided in the housing 2 to form a dedicated partition 48. When the end surface 61a of the fan case 61 and the end surface 54a of the heat sink 54 form a portion of the partition 48, similarly, it is possible to effectively use the inner space of the housing 2, as compared to the structure in which the dedicated partition 48 is provided in the housing 2.

When the holders 33 and 34 respectively holding the HDDs 31 and 32 form a portion of the partition 48, similarly, it is possible to effectively use the inner space of the housing 2, as compared to the structure in which the dedicated partition 48 is provided in the housing 2.

When the third cooling fan 59 that draws air from the outside of the housing 2 through the second inlet 24 and discharges the air to the second chamber 52 is provided, a push-pull blower structure is formed by the second and third cooling fans 58 and 59. Therefore, air smoothly flows in the second chamber 52 and it is possible to improve cooling efficiency.

When the cell board 55 extends between the first inlets 23 formed in the housing 2 and the intakes 68 of the first cooling fan 27 to form the ceiling of the first chamber 51, the size of the first chamber 51 is reduced, as compared to the structure in which the ceiling of the first chamber 51 is formed by the upper wall 6 of the housing 2. Therefore, the blowing efficiency of the first chamber 51 is improved and cooling efficiency is improved.

When the cell board 55 comprises the board surface 55a that defines one side of the air path D1 from the first inlets 23 to the first cooling fan 27 and the cell processor 74 is mounted on the board surface 55a, the cell processor 74 is directly cooled by the cooling air flowing through the air path D1. Therefore, cooling efficiency is improved.

The bracket 77 that supports the end portion of the cell board 55 is provided so as to protrude from the end portion of the cell board 55 to the side opposite to the first inlets 23 such that the air path D1 is extended. In this case, the leakage of cooling air from the first chamber 51 is reduced, and cooling efficiency is improved.

When the tuner board 56 comprises the board surface 56a that defines the air path D1 from the side opposite to the cell board 55 and the tuner 81 is mounted on the board surface 56a, the tuner 81 is directly cooled by cooling air flowing through the air path D1. Therefore, the cooling efficiency is improved.

The television connecting apparatus 1 according to this embodiment comprises the image processing board 57 having the image processing chip 82 that emits a smaller amount of heat than the cell processor 74 or the tuner 81, and the image processing board 57 is disposed opposite to the cell board 55 with the tuner board 56 interposed therebetween. That is, the cell board 55 and the tuner board 56 emitting a large amount of heat are arranged adjacent to each other and the main air path D1 is formed therebetween. In this way, it is possible to effectively cool the cell board 55 and the tuner board 56 emitting a large amount of heat.

The holder 33 that holds the HDD 31 so as to float from the bottom wall 8 of the housing 2 is provided and the gap S3 through which cooling air flows is formed between the HDD 31 and the bottom wall 8 of the housing 2. In this case, air smoothly flows in the second chamber 52, and cooling efficiency is improved.

An electronic apparatus according to an embodiment of the invention comprises: a housing that comprises a first wall comprising a first outlet and a second outlet and a second wall comprising a first inlet and a second inlet; a first heating element in the housing; a second heating element in the housing; a partition that partitions the inside of the housing into a first chamber that communicates with the first inlet and the first outlet and contains the first heating element and a second chamber that communicates with the second inlet and the second outlet and contains the second heating element; a first cooling fan that draws air in the first chamber and discharges the air to the first outlet; a second cooling fan that draws outside air through the second inlet and discharges the air into the second chamber; and a third cooling fan that draws air in the second chamber and discharges the air to the second outlet.

In this embodiment, an example of the "first wall" is the rear wall 12. An example of the "second wall" is the left wall 13. An example of the "first heating element" is the cell processor 74. An example of the "second heating element" is the first HDD 31. An example of the "first cooling fan" is the first cooling fan 27. An example of the "second cooling fan" is the third cooling fan 59. In this case, the name of the "second cooling fan" is changed for convenience of description. An example of the "third cooling fan" is the second cooling fan 58.

Although the television connecting apparatus 1 according to the embodiment of the invention has been described above, the invention is not limited thereto. The invention is not limited to the above-described embodiment as it is, but various modifications and changes of the elements can be made without departing from the scope and spirit of the invention at the implementation stage.

For example, the partition 48 is not necessarily formed by the heat sinks 42 and 43 or the first and second holders 33 and 34, but may be formed by an inner wall or a rib provided in the housing 2. The partition 48 may be provided at the entire boundary between the first and second chambers 51 and 52 and completely isolate the first and second chambers 51 and 52. Alternatively, as in the above-described embodiment, the partition 48 may be partially provided. In addition, the entire partition 48 may be a heat sink. The second chamber 52 is not limited to an L shape, but may have a rectangular shape.

In the above-described embodiment, the left wall 13 corresponds to the first side wall (third wall) according to the invention. However, the structure may be reversed in the left-right direction. For example, the right wall 14 may correspond to the first side wall (third wall) according to the invention and the first and second inlets 23 and 24 may be provided in the right wall 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing comprising a front wall, a rear wall comprising a first outlet and a second outlet, a side wall comprising a first inlet and a second inlet, and a bottom wall comprising a third inlet;

a heater in the housing;
a heat sink thermally connected to the heater and facing the first outlet;
a storage module along the front wall in the housing;
a partition between a first chamber comprising the heater and coupled to the first inlet, the third inlet, and the first outlet, and a second chamber comprising the storage module and coupled to the second inlet and the second outlet in the housing;
a first fan above the third inlet in the first chamber, comprising a first intake configured to draw air in the first chamber and a second intake configured to draw air outside the housing through the third inlet, the first fan being configured to discharge the air to the heat sink; and
a second fan in the second chamber, configured to draw air in the second chamber, and to discharge the air to the second outlet.

2. An electronic apparatus comprising:
a housing comprising a first wall comprising a first outlet and a second outlet, a second wall comprising a first inlet and a second inlet, and a bottom wall comprising a third inlet;
a first heater in the housing;
a second heater in the housing;
a partition between a first area comprising the first heater and coupled to the first inlet, the third inlet, and the first outlet, and a second area comprising the second heater and coupled to the second inlet and the second outlet in the housing;
a first fan configured to draw air in the first area, to draw air outside the housing through the third inlet, and to discharge the air through the first outlet;
a heat sink between the first fan and the first outlet, thermally connected to the first heater; and
a second fan configured to draw air in the second area, and to discharge the air through the second outlet.

3. The electronic apparatus of claim 2, further comprising:
an electronic component in the housing,
wherein at least a portion of the partition is a heat radiating plate thermally connected to the electronic component.

4. The electronic apparatus of claim 2,
wherein the first fan comprises a fan case, and
the partition comprises a surface of the fan case and a surface of the heat sink.

5. The electronic apparatus of claim 2,
wherein a portion of the partition is a holder configured to hold the second heater.

6. The electronic apparatus of claim 2, further comprising:
a first circuit board in the housing,
wherein the first fan comprises an intake in the first area, and the first circuit board is between the first inlet of the housing and the intake of the first fan, the first board being a ceiling of the first area.

7. The electronic apparatus of claim 6,
wherein the first circuit board comprises a first surface which defines one side of an air path from the first inlet to the first fan, the first circuit board comprising the first heater on the first surface.

8. The electronic apparatus of claim 7, further comprising
a bracket supporting an end portion of the first circuit board, and extending from the end portion of the first circuit board to a side opposite to the first inlet in order to extend the air path.

9. The electronic apparatus of claim 7, further comprising
a second circuit board comprising a second surface which defines the air path from an opposite side of the first circuit board, the second circuit board comprising a third heater on the second surface.

10. The electronic apparatus of claim 9, further comprising:
a third circuit board comprising a fourth heater configured to emit a smaller amount of heat than the first heater and the third heater,
wherein the second circuit board is between the first circuit board and the third circuit board.

11. The electronic apparatus of claim 2, further comprising:
a holder configured to hold the second heater away from the bottom wall of the housing,
wherein the second heater and the bottom wall define a gap through which air flows.

12. An electronic apparatus comprising:
a housing comprising a first wall, a second wall opposite to the first wall and comprising a first outlet and a second outlet, a third wall between an edge portion of the first wall and an edge portion of the second wall and comprising a first inlet and a second inlet, and a bottom wall comprising a third inlet;
a heater in the housing;
a heat sink thermally connected to the heater and facing the first outlet;
a storage module along the first wall in the housing;
a partition between a first chamber comprising the heater and coupled to the first inlet, the third inlet, and the first outlet, and a second chamber comprising the storage module and coupled to the second inlet and the second outlet in the housing;
a first fan above the third inlet in the first chamber, comprising a first intake configured to draw air in the first chamber, and a second intake configured to draw air outside the housing through the third inlet, the first fan being configured to discharge the air to the heat sink; and
a second fan in the second chamber configured to draw air in the second chamber, and to discharge the air to the second outlet.

13. The electronic apparatus of claim 2,
wherein the first area has a substantially rectangular shape, and the second area has a substantially L shape along a periphery of the first area.

14. The electronic apparatus of claim 13, further comprising:
a third fan configured to draw air outside the housing through the second inlet and to discharge the air into the second area, wherein the second fan and the third fan are at respective end portions of the second area having the substantially L shape and face in different directions.

15. The electronic apparatus of claim 14,
wherein the second fan and the third fan are axial-flow fans and configured to send air in different directions.

* * * * *